United States Patent [19]
Koduri

[11] Patent Number: 5,927,587
[45] Date of Patent: Jul. 27, 1999

[54] CAPILLARY HOLDER FOR WIRE BONDING CAPILLARY

[75] Inventor: Sreenivasan K. Koduri, Dallas, Tex.

[73] Assignee: Texas Instruments Incorporated, Dallas, Tex.

[21] Appl. No.: 08/992,830

[22] Filed: Dec. 17, 1997

Related U.S. Application Data

[60] Provisional application No. 60/033,514, Dec. 19, 1996.

[51] Int. Cl.⁶ .................................................. H01L 21/60
[52] U.S. Cl. .............................................. 228/4.5; 228/45
[58] Field of Search ................................ 228/4.5, 32, 45, 228/180.5

[56] References Cited

U.S. PATENT DOCUMENTS

| | | | |
|---|---|---|---|
| 3,542,277 | 11/1970 | Andrews et al. | 228/4.5 |
| 4,821,945 | 4/1989 | Chase et al. | 228/4.5 |
| 5,544,804 | 8/1996 | Test et al. | 228/180.5 |

*Primary Examiner*—Patrick Ryan
*Assistant Examiner*—Jeffrey T. Knapp
*Attorney, Agent, or Firm*—W. James Brady, III; Richard L. Donaldson

[57] ABSTRACT

A capillary holder is provided for holding a wire bonding capillary. The holder has a base and an extension extending therefrom to hold the capillary by contacting the capillary at at least two points. The extension can hold the capillary by frictional contact with either an inner or outer surface of the capillary. The base can either constitute a drive element or be coupled to a drive element which can be rotated by a rotation element. This imparts rotation to a capillary held by the capillary holder.

21 Claims, 3 Drawing Sheets

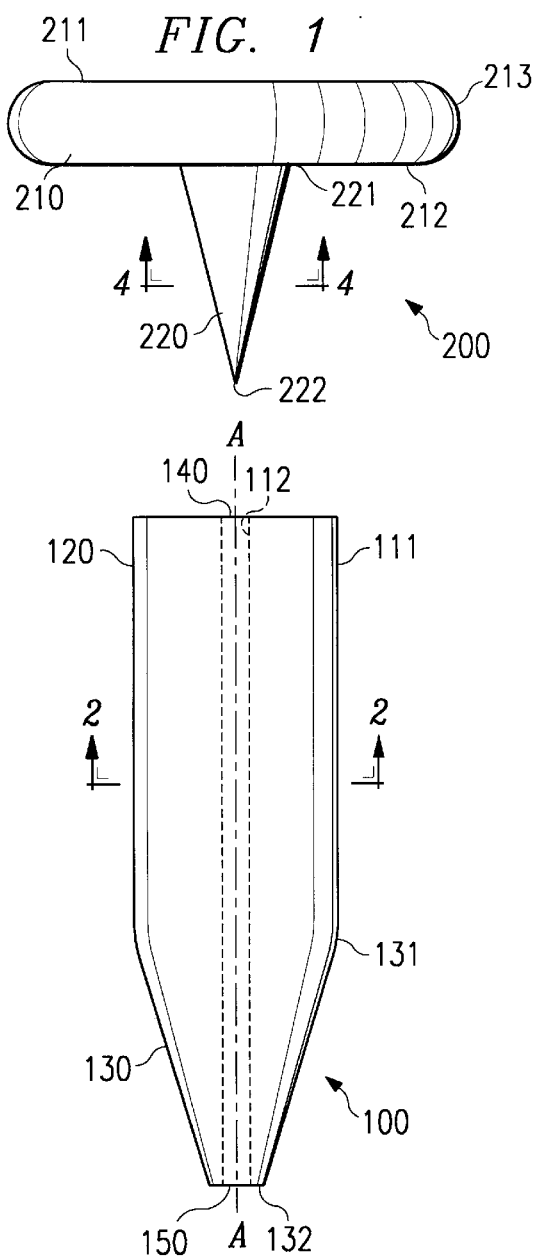
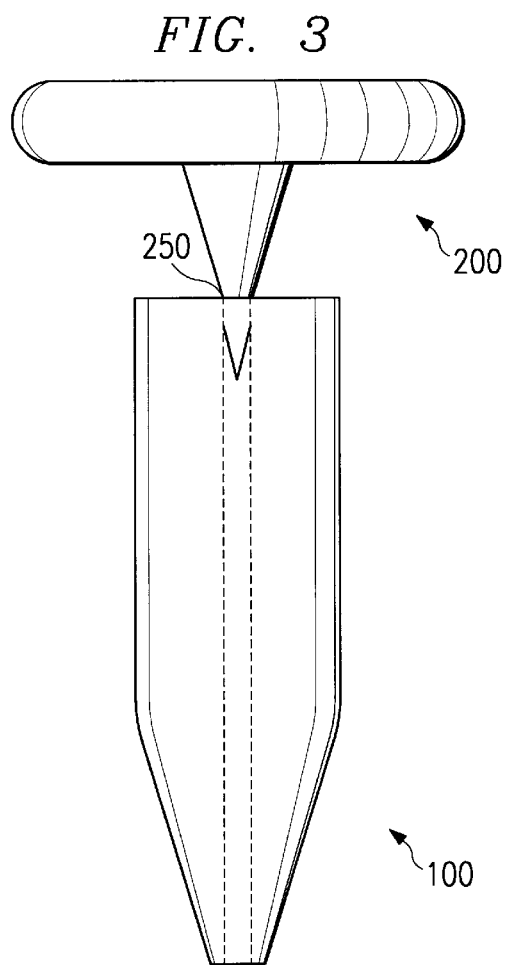
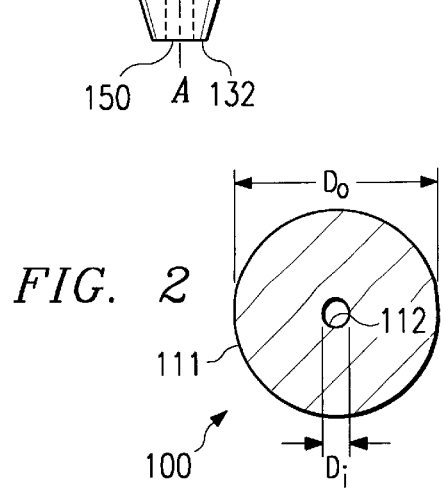
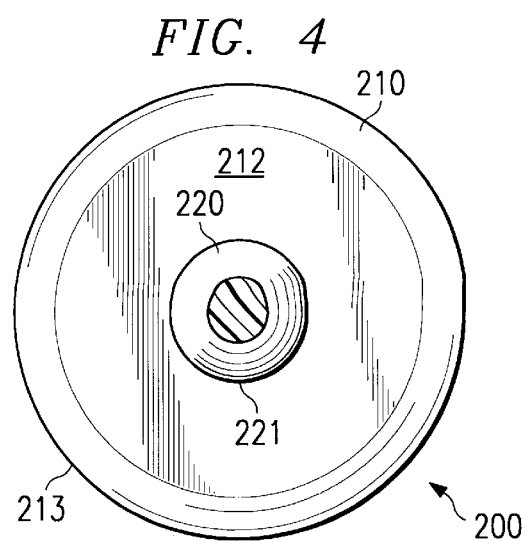

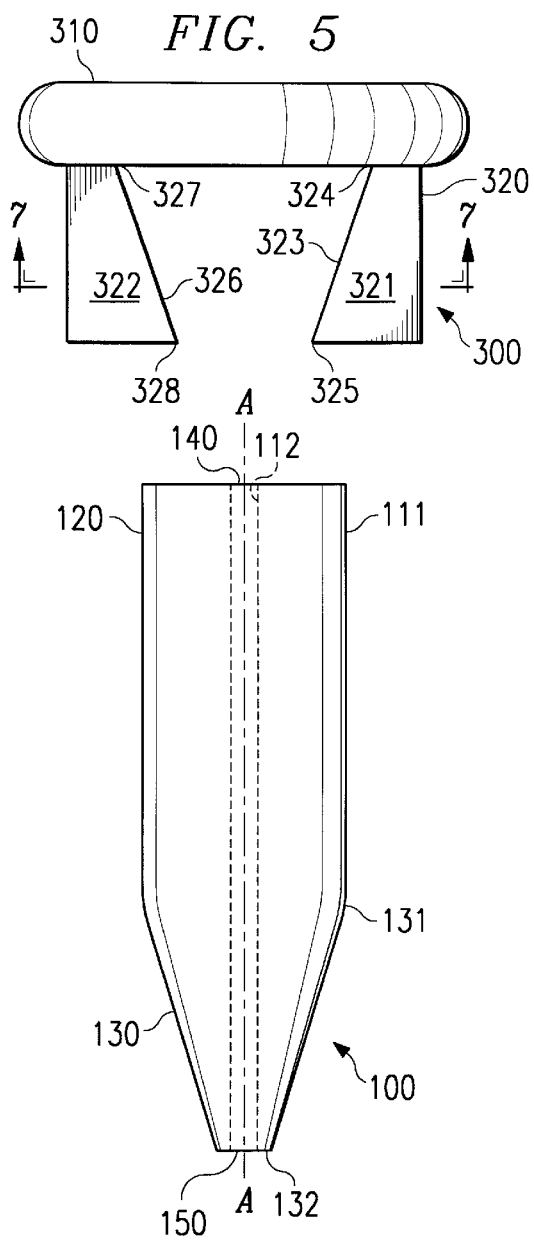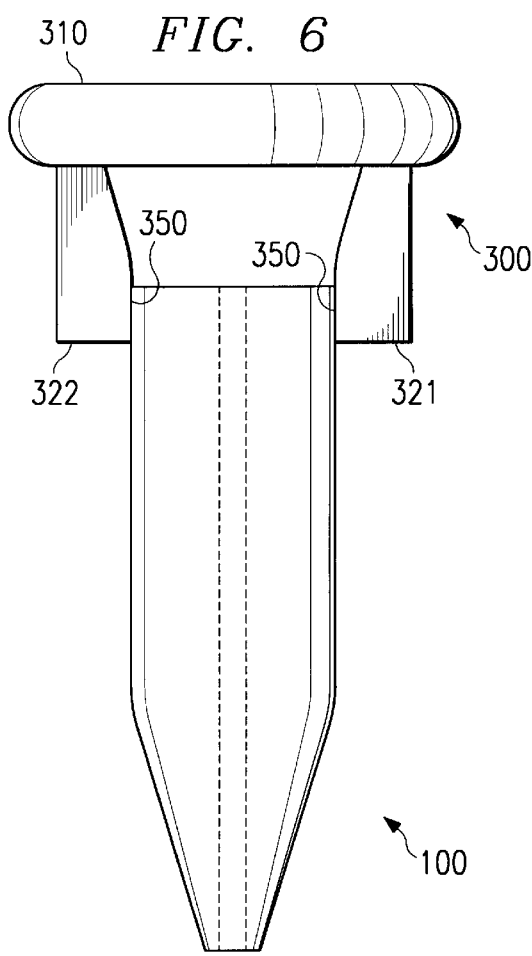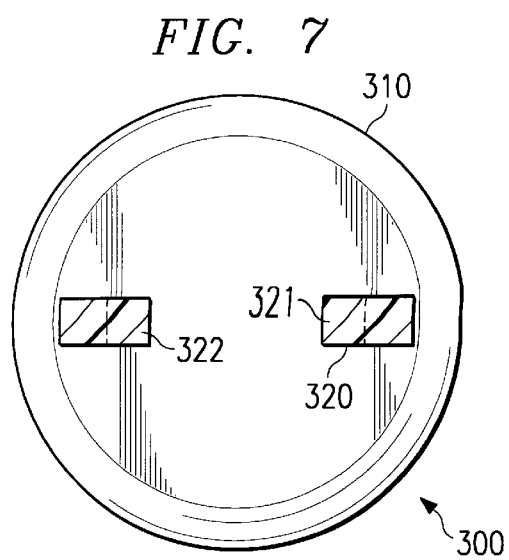

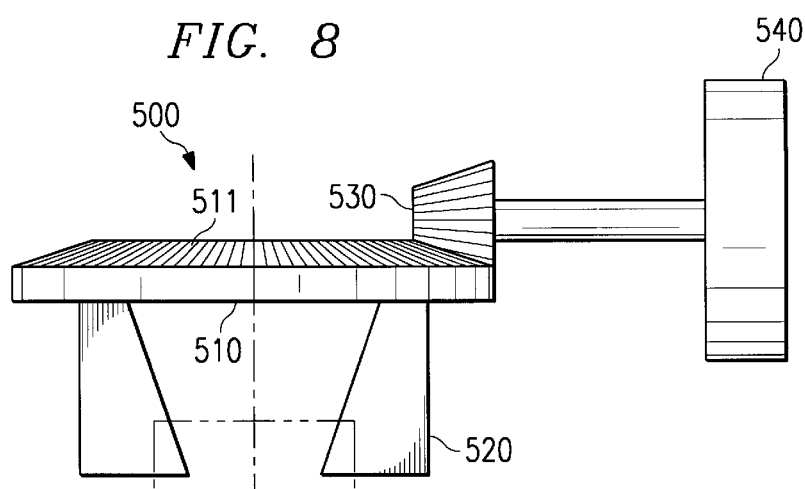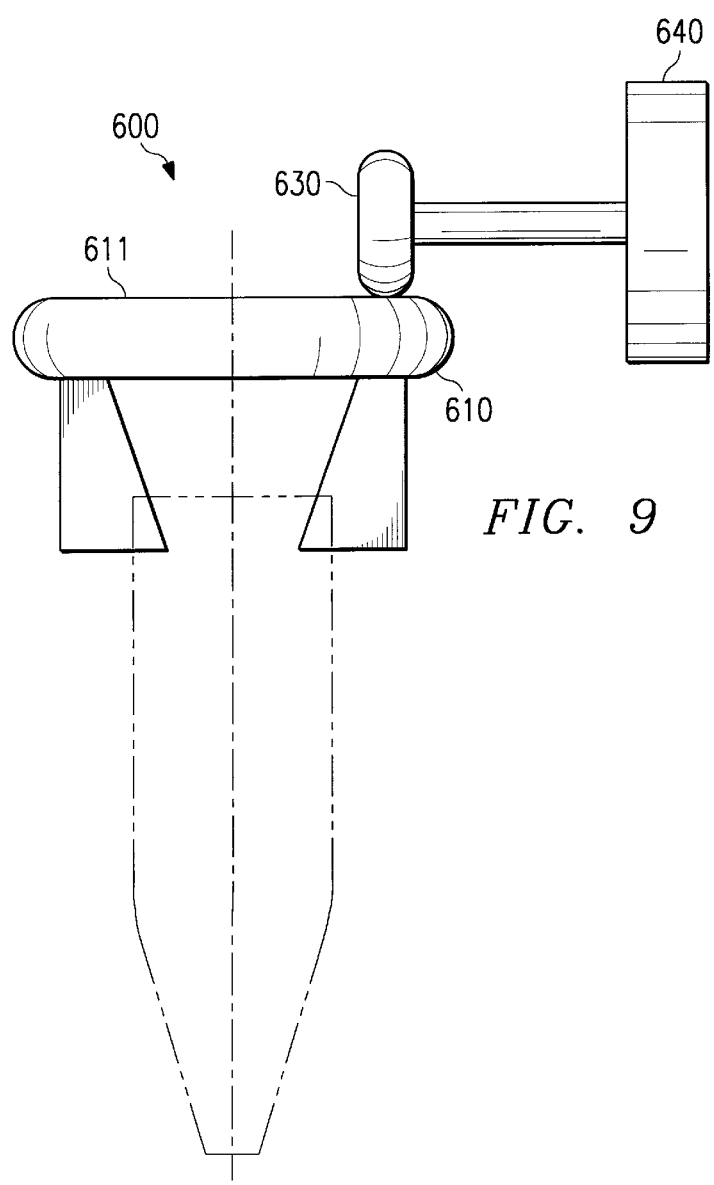

CAPILLARY HOLDER FOR WIRE BONDING CAPILLARY

This application claims priority under 35 USC § 119(e)(1) of provisional application No. 60/033,514 filed Dec. 19, 1996.

TECHNICAL FIELD OF THE INVENTION

The present invention generally relates wire bonding of integrated circuit chip packages and to capillaries used in the wire bonding process and, more particularly, to a capillary holder for holding a wire bonding capillary.

BACKGROUND OF THE INVENTION

Integrated circuit chip packages are typically formed by mounting an integrated circuit chip on a lead frame and coupling these two elements to form a package. The integrated circuit chip and lead frame may be encapsulated. Typically, the chip includes a number of bond pads which may be positioned about a perimeter of the chip according to a predetermined spacing between the bond pads. The lead frame typically includes a number of leads about a perimeter thereof. One type of lead frame, for example, has a generally rectangular shape with each side of the rectangle having a number of leads. The leads may each have a relatively narrow elongated shape.

A lead frame may be said to have an X direction and a Y direction. The X direction is perpendicular to one pair of opposing sides and the Y direction is perpendicular to the other pair of opposing sides. Typically, each lead has a relatively narrow elongated shape defining a lead axis. The lead axis for any given lead frame may extend in the X or Y direction, or be offset by an angle from either the X or Y direction. The angle of offset may vary from lead to lead. Moving from the center of a given side of the lead frame toward the corner leads, the lead axes may be angularly offset from perpendicular by increasing amounts. Also, a bonding path is defined by the direction from a bond pad to a corresponding lead. The bonding wire may extend along the bonding path. For any given set of corresponding bond pads and leads, the bonding path may extend in the X or Y direction, or be offset by an angle from either the X or Y direction.

In order to electrically couple the integrated circuit chip to the leads of the lead frame, a wire bonding technique is often used. A wire bonding machine may have a spool of bonding wire mounted on the machine. The bonding wire may be threaded through a capillary which is mounted to a horn of the wire bonding machine. The horn may be manipulated to move the capillary both vertically and horizontally. Typically, the wire bonding machine includes a device for heating or applying a spark to an end of the bonding wire which protrudes from an exit end of the capillary. The molten wire may form the shape of a ball which is placed on a target bond pad by manipulating the horn to move the capillary.

After this bond pad bond is created, a sufficient amount of bonding wire is released to allow the capillary to be moved to a location near an inner end of a target lead of the lead frame. The capillary is manipulated to connect the bonding wire to the inner end of the target lead and cut off the bonding wire so that the bonding wire protruding from the exit end of the capillary is now free to form a new wire bond between a new target bond pad and target lead. Any type of suitable bond may be made at either the bond pad or the lead, including ball bonds, stitch bonds and wedge bonds. A ball bond may be used, for example, at the bond pad. A stitch bond may be used, for example, at the lead. To complement the bonding process the package may be heated. Also, ultrasonic energy may be applied.

Problems in wire bonding techniques arise in part from the desire to increase the number of leads in a given package and to make integrated circuit chip packages smaller and smaller. This may require that the bonding pads located on the chip be made smaller and be spaced closer together. The same can be said for the leads on a lead frame.

The exit end of a wire bonding capillary is often referred to as the capillary face. Previous capillaries have had a circular face. A disadvantage of having a capillary with a circular face is that the spacing between bonds is limited. After a bond is made at a particular bond pad, for example, if the adjacent bond pad is too close then the capillary face may strike the ball bond which has been made at the first bond pad during the process of making a bond on the adjacent bond pad. One method for solving this shortcoming is to use a wire bonding capillary with a non-circular face. This type of approach is shown, for example, in U.S. Pat. No. 5,544,804 issued to Test et al., which is hereby incorporated by reference for all purposes. The Test et al. patent shows a BowTI™ capillary having a non-circular face. The face of a BowTI™ capillary may have a shape which includes a pair of opposed convex sides joining a pair of opposed concave sides. The BowTI™ capillary may be generally described as having a longitudinal axis extending across the midpoints of the convex sides and through the center of the BowTI™. The BowTI™ capillary allows ball bonds, for example, to be made closer to one another than with a circular capillary face. This can be accomplished because the concave sides avoid striking adjacent bonds. The BowTI™ capillary can also make other types of bonds including stitch bonds.

A need arising from the use of capillaries having non-circular faces is precise alignment of the longitudinal axis of the capillary face along either the X or Y direction of the lead frame, or along the longitudinal axis of a target lead, or along a given bonding path as necessary. Precise alignment of non-circular capillaries is especially difficult due to the relatively small size of a typical capillary face (e.g., 4–8 mils). Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond.

Also, typical wire bonding equipment and capillary installation techniques do not ensure precise alignment of capillaries upon installation of the capillary onto, for example, the horn of a wire bonding machine. Typically, a capillary is removed from a package and is manually inserted into the horn by holding the capillary in one's fingers and placing it into the mounting receptacle of the horn. Due to the small size of a typical capillary, using one's fingers is an ineffective technique for installing and aligning the capillary. For assistance in the installation process, one may use a pinching tool, such as a pair of tweezers, to grip the capillary. However, available tools are not specifically designed to hold capillaries and, as with a pair of tweezers, are not well suited to holding the capillary during transfer of the capillary from its package to the wire bonding machine. Further, in the event it is necessary to rotate the capillary prior to locking the capillary into the mounting receptacle of the horn, rotation must be accomplished by hand or with the pinching tool which is not suited to, and not specifically designed for use with, a wire bonding capillary.

Improper alignment of the capillary, particularly in view of the decreasing size of integrated circuit chip packages, can lead to defective wire bonds during the manufacturing process. This can result from many factors including improper positioning of the capillary face over the bond pad, the lead or both. Defective wire bonding can also occur when improper alignment causes the capillary to strike and/or damage an existing bond during the formation of a subsequent bond. Other problems, shortcomings and disadvantages of known capillaries and wire bonding techniques exist.

SUMMARY OF THE INVENTION

It is an object of the present invention to address the needs associated with wire bonding equipment and capillary installation and alignment techniques.

It is another object of the present invention to provide a tool specifically designed for holding a capillary during transfer of a capillary from its package to a wire bonding machine.

It is another object of the present invention to provide a device specifically designed for holding a capillary while installing the capillary into a wire bonding machine.

It is another object of the present invention to provide a device specifically designed for holding a capillary during installation of the capillary into a wire bonding machine, the device assisting in rotating the capillary to a desired rotational or angular alignment.

It is another object of the present invention to provide a device specifically designed for holding a capillary after installation and during wire bonding, the device assisting in rotating the capillary to a desired rotational or angular alignment.

To accomplish these and other objects of the present invention, a capillary holder is provided for holding a wire bonding capillary. The holder includes a base and an extension extending from the base. The extension is adapted to hold the capillary by contact between the extension and a surface of the capillary.

According to one aspect, the extension is adapted to hold the capillary due to friction between the extension and the capillary. According to another aspect, the extension holds the capillary by contacting at least two points on a surface of the capillary. According to another aspect, the base and the extension are integral and rotation of the base imparts rotation to the capillary.

In a first embodiment of the present invention, a capillary has an inner surface and an outer surface. The extension is adapted to hold the capillary by contacting the inner surface. According to a feature of this embodiment, the extension may be tapered from the base and inserted into an end of the capillary to hold the capillary by frictional contact with the inner surface of the capillary.

According to a second embodiment of the present invention, the capillary has an inner surface and an outer surface. The extension is adapted to hold the capillary by contacting the outer surface. According to a feature of this embodiment, the extension may include a first projection and a second projection. Each of the projections may have a protrusion oriented such that the protrusions extend toward one another. The protrusions may comprise flared portions of the first and second projections. The outer surface of the capillary may be gripped between the protrusions of the first and second projections.

According to a third embodiment, a capillary includes a base and an extension extending from the base. The extension is adapted to hold the capillary by contact therewith. The base includes a drive element for receiving an external force to impart rotation to the extension to rotate the capillary.

BRIEF DESCRIPTION OF THE DRAWINGS

For a more complete understanding of the present invention and the advantages thereof, reference is now made to the following detailed description in conjunction with the accompanying drawings, wherein like reference numerals represent like parts, in which:

FIG. 1 depicts a capillary holder and a capillary in an uncoupled, rest state according to a first embodiment of the present invention;

FIG. 2 is a cross section of the capillary of FIG. 1 taken along arrows 2—2;

FIG. 3 depicts the capillary holder and capillary of FIG. 1 in a coupled, holding state;

FIG. 4 is a cross section of the capillary holder of FIG. 1 taken along arrows 4—4;

FIG. 5 depicts a capillary holder and a capillary in an uncoupled, rest state according to a second embodiment of the present invention;

FIG. 6 depicts the capillary holder and capillary of FIG. 5 in a coupled, holding state;

FIG. 7 is a cross section of the capillary holder shown in FIG. 5 and taken along arrows 7—7;

FIG. 8 depicts a capillary holder according to a third embodiment of the present invention; and FIG. 9 depicts a capillary holder according to an alternative aspect of the third embodiment.

DETAILED DESCRIPTION OF THE INVENTION

The present invention generally encompasses devices and methods to assist in the alignment and realignment of capillaries during installation onto a wire bonding machine and during the process of wire bonding integrated circuit chip packages.

A wire bonding system may include a wire bonding machine which has a horn. A capillary is mounted into the horn and guides bonding wire from a source to various bonding points on the integrated circuit chip package. The capillary may have one or more indicators located thereon which provide one or more signals to be received by one or more detectors spaced from the capillary. The signals indicate the rotational alignment of the capillary. Therefore, the signal also indicates the direction of an axis of the face of the capillary. Each signal may have a relative signal strength which indicates an angular offset of the capillary face compared to a predetermined, desired alignment.

During operation, the capillary may be rotated to a first rotational alignment at which the capillary face axis extends in a first direction. A first signal received by the detector indicates when the first rotational alignment has been achieved. A first bond may then be made at a first bond point (e.g., at a bond pad on the integrated circuit chip) by guiding the capillary to the first bond point.

The capillary may then be realigned by rotating the capillary to a second rotational alignment so that the capillary face axis extends in a second direction different from the first direction. A second bond may then be made at a second bond point (e.g., at a lead on the lead frame) by guiding the capillary to the second bond point.

The capillary may then be rotated back to the first direction or to a third direction for a subsequent bond (e.g., at a second bond pad on the integrated circuit chip). Rotation of the capillary is achieved by the cooperation of the indicators and detectors and the production of signals which indicate rotational alignment and realignment. The ability to precisely rotate the capillary is especially beneficial for capillaries with non-circular faces. An axis of a non-circular face is ideally aligned in the direction of bonding when a bond is made. For example, it may be desirable to align the capillary face axis along the lead axis. Furthermore, as wire bonds are made around an integrated circuit chip package, the direction of bonding may change. The present invention is adapted to changing bonding directions. Further aspects of an overall capillary alignment system are disclosed in U.S. patent application Ser. No. 08/993,638 (Attorney Docket No. TI-24970) which is assigned to Texas Instruments Incorporated. This application was filed on Dec. 18, 1997 and is hereby incorporated by reference for all purposes.

The present invention provides devices and methods to assist in capillary installation, alignment and realignment. In FIG. 1, for example, capillary 100 is shown together with capillary holder 200. Capillary 100 has a tubular body comprising a shaft portion 120 which is integral with a tip portion 130. Capillary 100 has a longitudinal bore extending through its interior in the general direction of longitudinal axis AA. The bore of capillary 100 has an entry end 140 and an exit end 150. Bonding wire (not shown) may be inserted into entry end 140 to extend through the interior of capillary 100 and exit from capillary 100 through exit end 150.

Preferably, shaft portion 120 is cylindrical in shape and has a circular cross section as shown more clearly in FIG. 2. However, other shapes may be used so long as the bonding wire may be threaded through the interior of capillary 100. For example, the capillary may have a rectangular or elliptical cross section. Preferably, the cross section of shaft portion 120 of capillary 100 is defined by an inner diameter ($D_i$) and an outer diameter ($D_o$). Preferably, inner diameter $D_i$ is constant throughout an entire length of the bore of capillary 100. However, if capillary 100 has a constant wall thickness, then $D_i$ will vary according to changes in $D_o$.

Preferably, tip portion 130 is tapered from a first point 131, where tip portion 130 meets shaft portion 120, to a second point 132 located at the exit end 150 of capillary 100. Preferably, the outer diameter of tip portion 130 at first point 131, is equal to $D_o$ of shaft portion 120. Preferably, the outer diameter of tip portion 130 at second point 132, is a predetermined value which is less than the outer diameter at first point 131.

Capillary 100 may be formed from any suitable material. However, it is preferable that capillary 100 is formed from a high-strength material. For example, capillary 100 may be formed from a high-strength ceramic material. As shown in FIG. 2, capillary 100 has a circular cross section. Capillary 100 is defined by outer surface 111 and inner surface 112.

A capillary holder according to a first embodiment is shown in FIGS. 1, 3 and 4. Capillary holder 200 comprises a base 210 and an extension 220, which extends from base 210. Preferably, capillary holder 200 is formed from a flexible, resilient material such as an elastomer, and is formed so that base 210 and extension 220 are integral with each other. Other materials may be used to form capillary holder 210. However, it is preferable that at least extension 220 is formed from a flexible, resilient material, such as an elastomer, so that the extension 220 may grip a surface of capillary 100 by frictional contact therewith.

Preferably, base 210 has a disc-shaped cross section as shown in FIG. 4. However, base 210 may have other cross-sectional shapes. Base 200 has a first side surface 211 and a second side surface 212. An edge surface 213 extends about a perimeter of base 210 between first and second side surface 211 and 212. Preferably, base 210 is substantially planar, as shown in FIG. 1, and is relatively thin between first and second side surface 211 and 212. Edge surface 213 can be rounded as shown in FIG. 1. Alternatively, edge surface 213 may be straight or may have some other shape, such as teeth.

Extension 220 is shown extending substantially perpendicularly from second side surface 212 of base 210. Preferably, extension 220 extends perpendicularly from base 210 in order to assist in rotational movement of capillary 100 due to rotation of base 210. However, under certain circumstances, extension 220 may extend from base 210 at an angle other than ninety degrees as defined between a longitudinal axis of extension 220 and the plane of base 210.

Extension 220 extends from a first point 221 to a second point 222. Extension 220 and base 210 meet at first point 221. Second point 222 is the terminal end of extension 220. As shown in FIG. 1, extension 220 is preferably inwardly tapered from first point 221 to second point 222. Preferably, extension 220 has a circular cross section at any point along its longitudinal axis and is therefore conical in shape. Preferably, extension 220 terminates at second point 222 in a point. However, under certain conditions, it is acceptable that extension 220 not terminate in a point. The diameter of extension 220 at second point 222 is preferably less than $D_i$ of shaft portion 120 of capillary 100. This aids in allowing extension 220 to be inserted into entry end 140 of capillary 100. Preferably, a diameter of extension 220 at first point 221 is greater than $D_i$ of capillary 100. This aids in producing the contact necessary to enable capillary holder 200 to hold capillary 100. Extension 220 should, therefore, have at least one portion with a diameter larger than $D_i$ of shaft portion 120.

To hold capillary 100, extension 220 of capillary holder 200 is inserted into entry end 140 of the bore of capillary 100. Extension 220 is inserted into capillary 100 at least until a point at which the diameter of extension 220 is equal to $D_i$. Preferably, extension 220 is inserted past this point so that the material of extension 220 is compressed as shown, for example, at points 250 in FIG. 3. The material of extension 220 exerts a force outwardly against inner surface 112 of capillary 100. This allows capillary holder 200 to hold capillary 100 due to frictional contact between the surfaces of these elements.

As described above, extension 220 is preferably conical in shape. Therefore, at at least one point along the longitudinal axis of extension 220, the cross section of extension 220 should have the same dimensions as a cross section of the space within inner surface 112 of capillary 100. However, the cross sections of these two elements do not necessarily have to match each other. For example, if extension 220 was in the shape of a wedge, it could be tapered and have a rectangular cross section. When the cross section of both the inner space of the capillary and the extension are circular, there is contact between these two elements at an infinite number of points. When the cross sections are of different shapes, compression of the extension may be achieved as long as the extension contacts inner surface 112 at at least two points. For example, an extension having a rectangular cross section might contact a capillary having a circular cross section at four points. An extension having a triangular cross section might contact such a capillary at three points. An extension having a diamond-shaped cross section might contact such a capillary at two points, and so on.

In FIG. 1, capillary holder 200 and capillary 100 are shown in a rest state. That is, these elements are shown in a state in which they are not coupled and capillary holder 200 is not providing a holding function. In FIG. 3, capillary holder 200 is in a holding state. In other words, capillary holder 200 is shown to be coupled to capillary 100. Due to the dimensions and compressive features described above, a rest state distance between the points on capillary holder 200 which contact capillary 100 (e.g., at 250) is greater than the holding state distance between these points. A reaction force is created by the compression of extension 220. The reaction force holds extension 220 against the capillary surface.

It should be noted that capillary holder 200 can provide a holding function after the capillary is installed onto a wire bonding machine and during the wire bonding process. For instance, capillary holder 200 can be provided with a hole extending along its longitudinal centerline to accommodate bonding wire. The hole would, for example, extend through the center of base 210 and extension 220. Thus, capillary holder 200 may assist in rotation of the capillary if needed. Rotation of holder 200 would impart rotation to the capillary.

In a second embodiment, the capillary holder has an extension which is designed to hold the capillary by contacting outer surface 111 of the capillary 100. More specifically, as shown in FIG. 5, capillary holder 300 comprises base 310 and extension 320. In this embodiment, extension 320 includes a first projection 321 and a second projection 322. Preferably, projections 321 and 322 are integral with base 310.

First and second projections 321 and 322 each have a protrusion oriented such that the protrusions extend toward one another. As shown in FIG. 5, for example, the longitudinal sections of projections 321 and 322 are trapezoidal in shape. First projection 321 has a first protrusion, which is first flared portion 323. Portion 323 is flared from a first point 324 located at the base to a second point 325 located at a terminal end of first projection 321. Second projection 322 has a second protrusion, which is second flared portion 326. Portion 326 is flared from a first point 327 located at the base 310 to a second point 328 located at a terminal end of second projection 322.

Preferably, a distance between second points 325 and 328 is less than $D_o$ of capillary 100. Preferably, a distance between first points 324 and 327 is greater than $D_o$. Preferably, as shown in FIG. 7, first and second projections 321 and 322 each have a cross-sectional shape which is rectangular. When capillary holder 300 is placed onto capillary 100, first and second flared portions 323 and 326 are preferably compressed to push inwardly against the outer surface 111 of capillary 100 as shown, for example, at points 350 in FIG. 6. This allows capillary holder 300 to grip capillary 100 by holding capillary 100 between first and second projections 321 and 322 due to contact between the respective surfaces thereof. Preferably, this contact is frictional. Also, in this embodiment, since first and second projections have rectangular cross sections, they also have flat inner edges. Therefore, if the capillary 100 has a circular cross section, then the first and second projections will contact capillary 100 at two points.

As with the previous embodiment, both the capillary and the projections may have other shapes and still provide a holding function by contact between the extension 320 and the outer surface 111 of capillary 100. For example, the first and second projections may have flared protrusions, each having an arcuate inner edge (e.g., generally located in the regions designated by second points 325 and 328, respectively, in FIG. 5). This would allow contact between the first and second projections and outer surface 111 at an infinite number of points. Alternatively, if capillary 100 has flat portions on its outer surface, then the flat inner edges of projections 321 and 322 may be able to contact capillary 100 at an infinite number of points.

In FIG. 5, capillary holder 300 and capillary 100 are shown in a rest state. That is, these elements are shown in a state in which they are not coupled and capillary holder 300 is not providing a holding function. In FIG. 6, capillary holder 300 is in a holding state. In other words, capillary holder 300 is shown to be coupled to capillary 100. Due to the dimensions and compressive features described above, a rest state distance between the points of capillary holder 300 which contact capillary 100 (e.g., at 350) is less than the holding state distance between these points. Compression of the projections creates a reaction force which holds the projections against the capillary surface.

It should be noted that capillary holder 300 can provide a holding function after the capillary is installed onto a wire bonding machine and during the wire bonding process. For instance, capillary holder 300 can be provided with a hole extending along its longitudinal axis to accommodate bonding wire. The hole would, for example, extend through the center of base 310. Optionally, the hole provided in capillary holder 300 can be sized to accommodate capillary 100. Therefore, the capillary holder could be positioned about the shaft portion of the capillary at any point along the longitudinal axis of the capillary. Due to the configuration of projections 321 and 322, the capillary holder can still grip the capillary. Thus, capillary holder 300 may assist in rotation of the capillary if needed. Rotation of holder 300 would impart rotation to the capillary.

In a third embodiment, as shown in FIG. 8, capillary holder 500 comprises base 510 and extension 520. A rotation element 530 is coupled to a power source 540 to provide rotation of rotation element 530. Base 510 comprises drive element 511. Preferably, rotation is imparted to the base 510 due to frictional contact between the drive element 511 and the rotation element 530. For example, rotation element 530 can engage drive element 511. Rotation of rotation element 530 causes capillary holder 500 to rotate, thereby rotating extension 520. If capillary holder 500 is coupled to capillary 100, then capillary 100 will also rotate. Thus, a surface of base 510 is adapted to impart rotation to the base upon contact with the rotation element 530.

As shown in FIG. 8, rotation element 530 comprises a first gear and drive element 511 comprises a second gear which interfits with the first gear. Also, the second gear forms base 510. Alternatively, the second gear could be coupled to a separate portion to jointly form base 510.

Preferably, rotation element 530 rotates in a first plane and drive element 511 rotates in a second plane which is perpendicular to the first plane. Under certain conditions, the first and second planes do not have to be perpendicular to each other and can be offset by any angle. Also, the first and second planes may be coplanar. For example, rotation element 530 and drive element 511 may comprise gears having teeth located about peripheral edges thereof. When the teeth interfit, the gears can cooperatively rotate in the same plane.

Also, rotation can be achieved without the use of gears. For example, depending upon the material and shape of the base, rotation may be achieved due to frictional contact between a surface of the rotation element and a surface of the base. In FIG. 9, for example, base 610 comprises rubber or a rubber-like material. Rotation element 630 comprises a similar material. Rotation is achieved due to frictional contact between rotation element 630 and drive element 611, which comprises a surface of base 610.

As with the previous embodiments, a hole may be provided through the capillary holder to accommodate bonding wire. Therefore, the capillary holder can provide a holding function after installation and during the wire bonding process. For example, rotation of the capillary holder imparts rotation to the capillary if needed.

The present invention and its advantages have been described in detail. However, it should be understood that various changes, substitutions, and alterations can be made herein without departing from the spirit and scope of the invention as defined by the appended claims.

What is claimed is:

1. A capillary holder for holding a wire bonding capillary, the capillary holder comprising:
   a base;
   a first projection extending from the base, the first projection having a first inwardly-facing protrusion; and
   a second projection extending from the base and spaced apart from the first projection, the second projection having a second inwardly-facing protrusion,
   wherein the first and second protrusions extend toward one another and cooperate to hold the capillary therebetween.

2. The capillary holder of claim 1, the first and second protrusion comprising flared inner edges of the first and second projections, respectively.

3. The capillary holder of claim 1, a rest-state distance between the first and second protrusions being less than a holding-state distance between the first and second protrusions.

4. A capillary holder for holding and rotating a wire bonding capillary in response to an external force, the holder comprising:
   a base; and
   an extension extending from the base and adapted to hold the capillary by contact between the extension and the capillary,
   the base comprising a drive element for receiving the external force to impart rotation to the extension to rotate the capillary.

5. The capillary holder of claim 4, wherein the external force is supplied by a first gear, the drive element comprising a second gear adapted to interfit with the first gear, the second gear being coupled to the extension.

6. The capillary holder of claim 4, wherein the external force is supplied by a rotation element, the drive element comprising a surface of the base being adapted to impart rotation to the base upon frictional contact with the rotation element.

7. The capillary holder of claim 6, wherein the rotation element is adapted for rotation in a first plane, and wherein the drive element is adapted for rotation in a second plane different from the first plane.

8. A capillary holder for holding a wire bonding capillary, the capillary holder comprising:
   a base; and
   an extension extending from the base, the extension adapted to be compressed by a surface of the capillary to create a reaction force for holding the extension against the surface of the capillary.

9. The capillary holder of claim 8, wherein the extension is adapted to hold the capillary due to friction between the extension and the capillary.

10. The capillary holder of claim 8, wherein the extension is adapted to hold the capillary by contacting at least two points on a surface of the capillary.

11. The capillary holder of claim 8, the extension being integral with the base.

12. The capillary holder of claim 8, the extension having a tapered portion.

13. The capillary holder of claim 8, the extension being cone-shaped and tapered from the base.

14. The capillary holder of claim 8, the extension comprising a first projection and a second projection, each of the first and second projections having a flared portion, the flared portions extending toward one another.

15. The capillary holder of claim 8, wherein rotation of the base imparts rotation to the capillary.

16. The capillary holder of claim 8, the extension being adapted to hold the capillary by contacting the capillary at a first point and at a second point, a rest-state distance between the first and second points being greater than a holding-state distance between the first and second points.

17. The capillary holder of claim 8, the extension being adapted to hold the capillary by contacting the capillary at a first point and at a second point, a rest-state distance between the first and second points being less than a holding-state distance between the first and second points.

18. The capillary holder of claim 8, wherein the capillary has an inner surface and an outer surface, the extension adapted to hold the capillary by contacting the inner surface.

19. The capillary holder of claim 8, wherein the capillary has an inner surface and an outer surface, the extension adapted to hold the capillary by contacting the outer surface.

20. The capillary holder of claim 8, wherein the extension comprises a flexible, resilient material.

21. The capillary holder of claim 20, wherein the flexible, resilient material is an elastomer.

* * * * *